US008150081B2

(12) United States Patent
Alfsmann

(10) Patent No.: US 8,150,081 B2
(45) Date of Patent: Apr. 3, 2012

(54) METHOD FOR OPTIMIZING A MULTILEVEL FILTER BANK AND CORRESPONDING FILTER BANK AND HEARING APPARATUS

(75) Inventor: Daniel Alfsmann, Bochum (DE)

(73) Assignee: Siemens Medical Instruments Pte. Ltd., Singapore (SG)

( * ) Notice: Subject to any disclaimer, the term of this patent is extended or adjusted under 35 U.S.C. 154(b) by 422 days.

(21) Appl. No.: 12/469,030

(22) Filed: May 20, 2009

(65) Prior Publication Data
US 2009/0290737 A1 Nov. 26, 2009

(30) Foreign Application Priority Data
May 21, 2008 (DE) .................. 10 2008 024 535

(51) Int. Cl.
*H04R 25/00* (2006.01)
(52) U.S. Cl. ....................... 381/320; 381/317
(58) Field of Classification Search ............ 381/320, 381/317
See application file for complete search history.

(56) References Cited

U.S. PATENT DOCUMENTS
6,104,822 A * 8/2000 Melanson et al. .......... 381/320

OTHER PUBLICATIONS

Brennan, R.; Schneider, T.: "A flexible filterbank structure for extensive signal manipulations in digital hearing aids", In. IEEE, Proceedings of the International Symposium on Circuits and Systems May 31-Jun. 3, 1998, ISCAS'98. vol. 6, pp. 569-572.
Yu Shao; Chip-Hong Chang: "A Generalized Time-Frequency Subtraction Method for Robust Speech Enhancement Based on Wavelet Filter Banks Modeling of Human Auditory System", In: IEEE Transactions on Systems; Man and Cybernetics. Part B: Cybernetics, vol. 37, No. 4, Aug. 2007, pp. 877-889.
Göckler, Heinz G.; Groth, Alexandra: Multiratensysteme Abtastratenumsetzung and digitate Filterbänke, Wildburgstetten, Schlembach Verlag, 2004, pp. 365-271, 388-392.

* cited by examiner

*Primary Examiner* — Jasmine Clark

(57) ABSTRACT

A filter bank system that is optimized with respect to group delay and power consumption is provided. The filter bank system has multiple levels and has an input-side and an output-side filter bank based on a defined filter type. The input-side filter bank has input channels as a variable first parameter, and an oversampling factor as a variable second parameter. For optimizing the multilevel filter bank, a group delay and an operation rate are now respectively determined for each of a plurality of value pairs of the first and second parameters. The value pair for which the associated group delay and the associated operation rate satisfy a defined criterion, in particular for which they are as low as possible, is selected from the value pairs. The input-side filter bank is subsequently configured with the number of channels and the oversampling factor corresponding to the selected value pair.

13 Claims, 4 Drawing Sheets

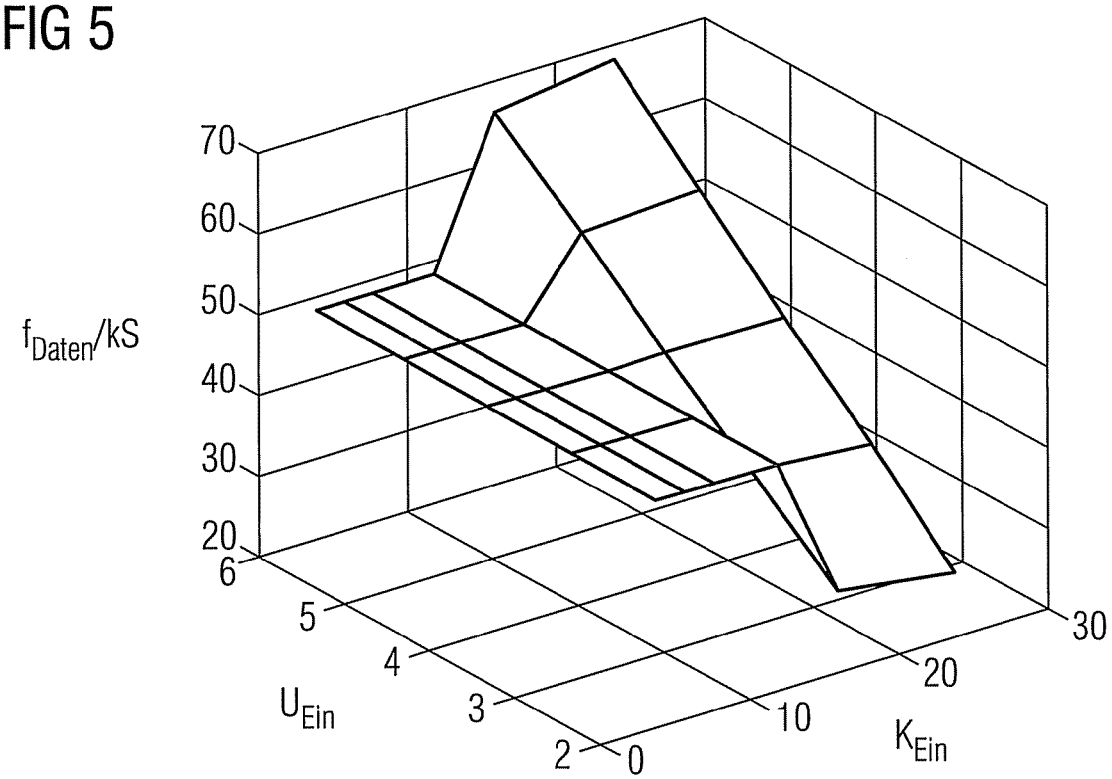

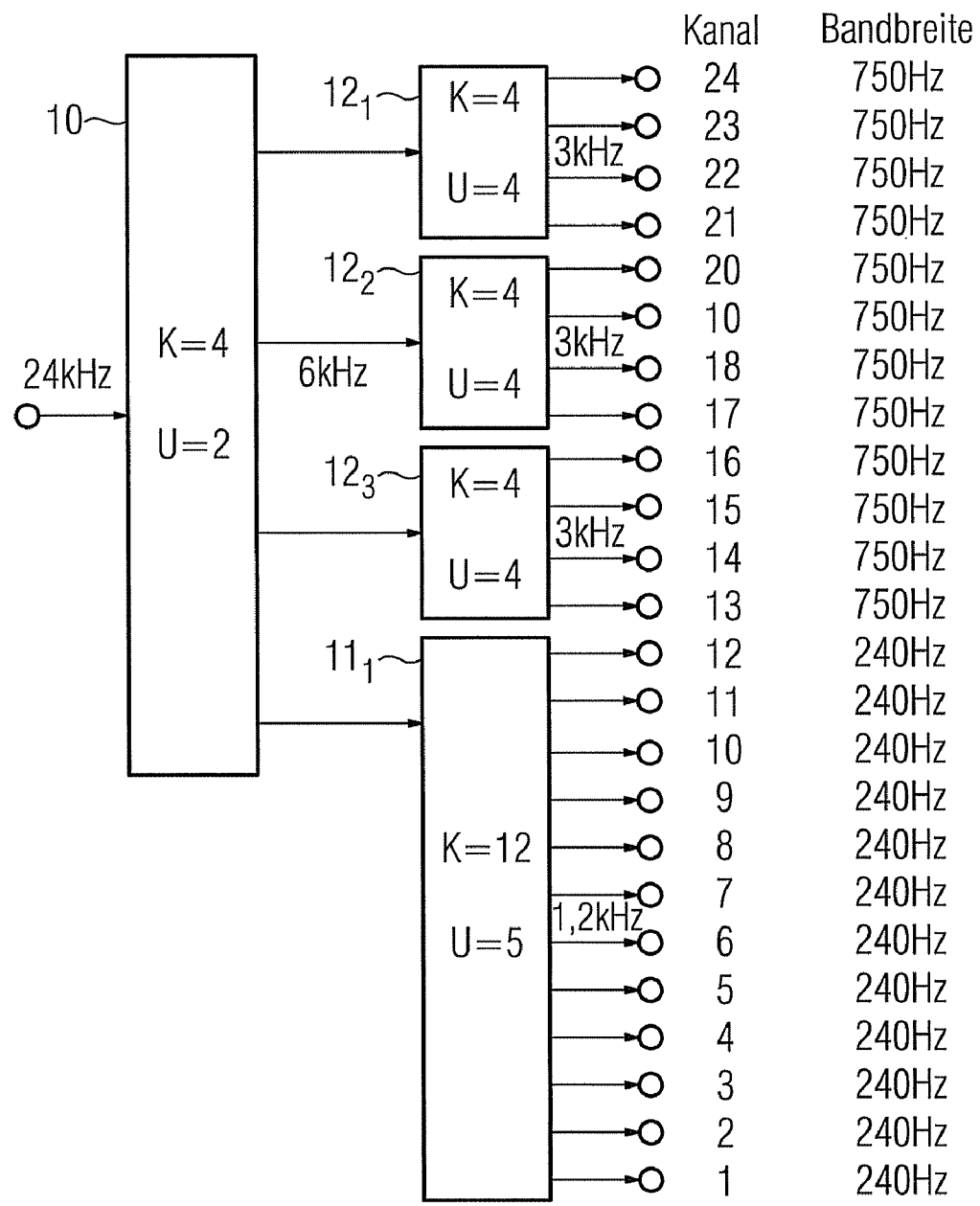

METHOD FOR OPTIMIZING A MULTILEVEL FILTER BANK AND CORRESPONDING FILTER BANK AND HEARING APPARATUS

CROSS REFERENCE TO RELATED APPLICATIONS

This application claims priority of German application No. 10 2008 024 535.6 DE filed May 21, 2008, which is incorporated by reference herein in its entirety.

FIELD OF INVENTION

The present invention relates to a method for optimizing a structure of a multilevel filter bank, which has an input-side and an output-side filter bank based on a defined filter type, with the input-side filter bank having the number of input channels as a variable first parameter, and an oversampling factor as a variable second parameter. In addition, the present invention relates to a multilevel filter bank whose structure is obtained using an above method. The present invention also relates to a hearing apparatus containing such a multilevel filter bank. The term "hearing apparatus" is understood to mean here any sound-emitting device that can be worn in or on the ear, in particular a hearing aid, a headset, earphones and the like.

BACKGROUND OF INVENTION

Hearing devices are portable hearing apparatuses that are used to assist the hard-of-hearing. To accommodate the numerous individual needs, different types of hearing aids are provided, such as behind-the-ear (BTE) hearing aids, hearing aids with an external earpiece (RIC: receiver in the canal) and in-the-ear (ITE) hearing aids e.g. also concha hearing aids or completely in the canal (CIC) hearing aids. The hearing devices cited by way of example are worn on the outer ear or in the ear canal. In addition, however, there are also bone conduction hearing aids, and implantable or vibrotactile hearing aids available on the market. In these housings the damaged hearing is stimulated either mechanically or electrically.

The main components of hearing aids are essentially an input transducer, an amplifier and an output transducer. The input transducer is normally an acoustic receiver e.g. a microphone, and/or an electromagnetic receiver e.g. an induction coil. The output transducer is usually implemented as an electro-acoustic transducer e.g. a miniature loudspeaker, or as an electromechanical transducer e.g. a bone conduction earpiece. The amplifier is usually integrated in a signal processing unit. This theoretical design is shown in FIG. 1 using the example of a behind-the-ear hearing aid. One or more microphones 2 for picking up the ambient sound are built into a hearing device housing 1 for wearing behind the ear. A signal processing unit 3, which is also built into the hearing aid housing 1, processes and amplifies the microphone signals. The output signal from the signal processing unit 3 is transmitted to a loudspeaker or earpiece 4, which outputs an acoustic signal. If necessary, the sound is transferred to the eardrum of the hearing device wearer via a sound tube that is fixed to an ear mold in the ear canal. A battery 5, which is also built into the hearing device housing 1, supplies power to the hearing device and in particular to the signal processing unit 3.

Acoustic signals that are picked up by one or more microphones of a hearing device are usually decomposed into sub-band signals for further processing. This is normally done using one or more frequency-selective digital analysis filter banks (AFB), by means of which K>1 sub-band signals are obtained. Sub-band-specific signal manipulations can be performed after the decomposition. The manipulated sub-band signals can subsequently be re-synthesized using a digital synthesis filter bank (SFB).

SUMMARY OF INVENTION

High quality filter banks in hearing devices need to meet certain requirements. For example, a channel bandwidth of about 250 Hz is required in the lowest bands. Otherwise the band spacing should be based approximately on the Bark scale. In addition, the minimum number of channels that is desirable is 22. Interference components caused by aliasing must definitely lie below 60 dB. Conventional methods of eliminating aliasing are not effective in hearing aids because of the intensive sub-band processing (in particular the high level of amplification required to compensate for the hearing loss). Hence "non-critical" sampling must always be used in the filter banks. In addition, the group delay (for AFB and SFB respectively) should lie considerably below 5 ms, and the group delay distortions must not exceed certain limits. In particular, the group delay must be kept as low as possible for high frequencies, which is a crucial limiting factor for the filter bank.

Filter banks having a multilevel tree structure and unequal band separation (Bark scale) are currently already being used, but without optimized stop-band attenuation and hence non-existent or insufficient downsampling (solution A). In addition, it is also known to use a single-level (for example complex modulated) filter bank (solution B). Finally, multilevel filter banks are also used for decomposition of the acoustic signals (solution C). Such a filter bank contains, for example, K channels having at least two different bandwidths, where the bandwidths are based on the limiting conditions set by the Bark scale, although channel groups have identical bandwidths. This yields advantages compared with solutions A and B.

Furthermore, a higher number of sub-bands is possible with the multilevel filter bank so that an improved resolution can be achieved compared with solution A, while also avoiding the need to implement an excessive number of sub-bands, which must be seen as an improvement on solution B.

In addition, with the multilevel filter bank, the sampling rate of the sub-band signals can be reduced to such a level that interference can be avoided (improvement compared with solution A). However, the sampling rate can only be reduced to the extent that interference from spectral aliasing is not produced by manipulation of the sub-band signals. This results in an improvement compared with known filter bank methods for aliasing compensation, for instance as described in Heinz Göckler and Alexandra Groth: "Multiratensysteme" ["Multirate systems"], Schlembach Verlag, Willburgstetten, 2004.

A flexible filter bank structure is known from the paper by Brennan, R.; Schneider, T.: A flexible filter bank structure for extensive signal manipulations in digital hearing aids; in IEEE, Proceedings of the International Symposium on Circuits and Systems 31 May-3 Jun. 1998, 1998. ISCAS '98. Volume 6, p. 569-572. This filter bank structure is composed of an analysis filter bank and a synthesis filter bank, with channel-dependent processing being performed between them. The filter bank is an oversampled filter bank designed to achieved a shortest possible time delay and high computer efficiency.

In addition, a filter bank modeling method for human hearing is described in the paper by Yu Shao; Chip-Hong Chang: A Generalized Time-Frequency Subtraction Method for Robust Speech Enhancement Based on Wavelet Filter Banks Modeling of Human Auditory System; in IEEE TRANSACTIONS ON SYSTEMS, MAN AND CYBERNETICS. PART B:CYBERNETICS, Vol. 37, No. 4, August 2007, 2007, p. 877-889. The signal-to-noise ratio is improved in order to improve the intelligibility of speech.

Hence the object of the present invention is to be able to provide a multilevel filter bank that has a minimum possible group delay in the sub-bands and that can be operated with minimum possible power consumption.

This object is achieved according to the invention by a method for optimizing a structure of a multilevel filter bank that comprises an input-side and an output-side filter bank based on a defined filter type, where the input-side filter bank has the number of channels as a variable first parameter, and an oversampling factor as a variable second parameter, comprising the following steps: determining a group delay for each of a plurality of value pairs of the first and second parameters, determining an operation rate for each of the plurality of value pairs of the first and second parameters, selecting one of the plurality of value pairs for which the associated group delay and the associated operation rate satisfy a defined criterion, and configuring the input-side filter bank with the number of channels and the oversampling factor corresponding to the selected value pair.

It is thereby advantageously possible to optimize successfully a filter bank system that has numerous parameters, such as number of useful-data channels of the input-side filter bank, oversampling factor of the input-side filter bank, number of output-side filter banks, number of useful-data channels of the output-side filter banks, oversampling factor of the output-side filter banks, "full tree" or "reduced tree" tree structure etc., merely using a few specifically selected parameters. Hence there is no need for a complex optimization process in a multidimensional space.

If the levels of the multilevel filter bank, i.e. the cascaded filter bank system, differ across the full width of the bank, a data rate can additionally be determined for each of the plurality of value pairs, this data rate constituting a cumulative sampling rate across all sub-bands of the multilevel filter bank, and being used to select one of the plurality of value pairs. Hence an additional analysis criterion is obtained that can be used to restrict the results space to a defined target area.

In a further development, a "near-perfect reconstruction" filter bank (NPR filter bank) can be used instead of conventionally used "perfect reconstruction" filter banks (PR filter banks). An NPR filter bank is usually adequate for intensive sub-band processing. Further savings in complexity and group delay can also be achieved with an NPR filter bank.

In addition, each sub-filter bank of the filter bank system may be an oversampled, complex modulated conventional (DFT) or frequency-shifted (GDFT) polyphase filter bank. Such filter banks have a wide range of possible variations, but are easy to optimize using the method according to the invention.

The defined criterion for optimization may be to minimize the group delay and the operation rate. If the two parameters do not have a minimum for one and the same value pair, then a suitable compromise must be chosen for the parameter values and the associated value pair (number of input channels and oversampling factor).

Using the method according to the invention, it is now advantageously possible to find a multilevel filter bank whose structure is optimized with respect to group delay and power consumption. Such a multilevel filter bank is particularly suitable for input signal processing in hearing apparatuses, especially in hearing devices.

BRIEF DESCRIPTION OF THE DRAWINGS

The present invention is now explained in greater detail using the enclosed drawings, in which:

FIG. 5 shows a diagram of the data rate of all sub-bands (total number of samples per unit of time) as a function of $K_{Ein}$ and $U_{Ein}$; and FIG. 6 shows a tree structure of an optimized filter bank design.

DETAILED DESCRIPTION OF INVENTION

Figure 1:
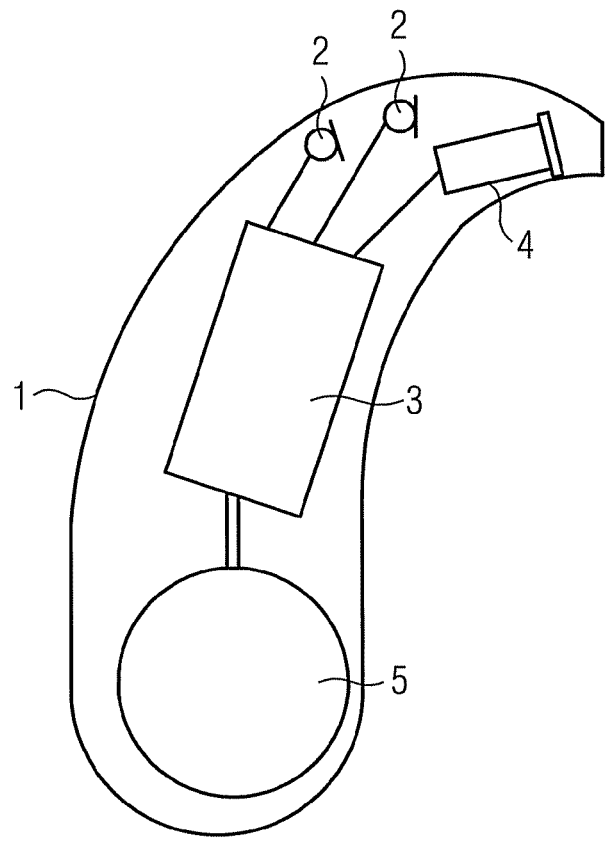
FIG. 1 shows the basic design of a hearing aid according to the prior art.
Figure 2:
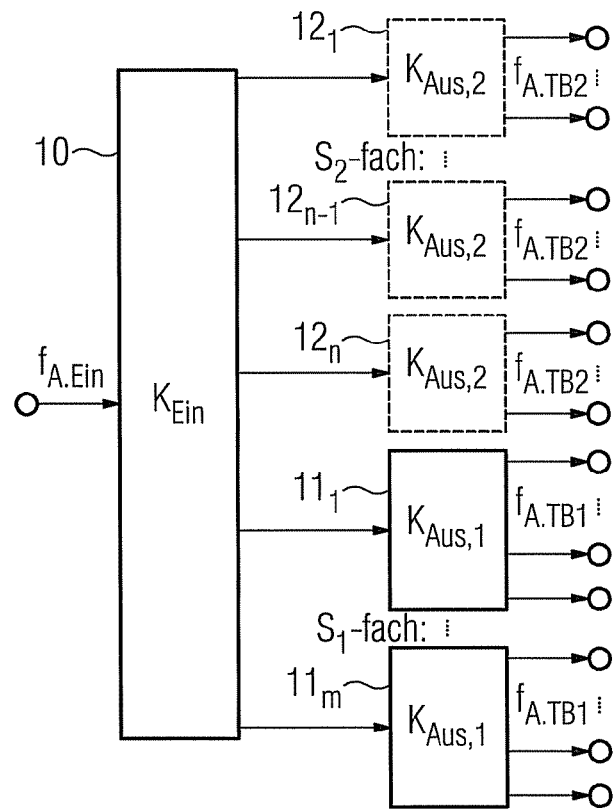
FIG. 2 shows a tree structure of a basic filter bank design to be optimized.

The embodiments described in greater detail below constitute preferred exemplary embodiments of the present invention. In the following example, a tree structure of a filter bank design as shown in FIG. 2 is used as the basis for the optimization method according to the invention. Such a basic filter bank design comprises an input-side filter bank 10 and a plurality of output-side filter banks $11_1$ to $11_m$ and $12_1$ to $12_n$. The number of channels $K_{Ein}$ in the input-side filter bank 10 is given by $K_{Ein}=n+m$. The sampling rate at the input of the filter bank 10 equals $f_{A,Ein}$.

The basic filter bank design contains simply two levels in this example. Hence, apart from the input-side filter bank 10 in the first level, it only has a second level containing the filter banks $11_1$ to $11_m$ and $12_1$ to $12_n$, each of which constitute conventional complex modulated filter banks. The number of useful-data channels in the filter banks $11_1$ to $11_m$ equals $K_{Aus,1}$, while the number of useful-data channels in the filter banks $12_1$ to $12_n$ equals $K_{Aus,2}$. The actual number of channels equals the product $U_{Ein} \cdot K_{Aus,1,2}$, where $U_{Ein}$ represents the oversampling factor of the input-side filter bank.

The output-side filter banks are hence composed simply of two different filter bank types in the chosen example. In this example, for a "full tree", the filter bank type having $K_{Aus,1}$ channels appears S1 times, and that type having $K_{Aus,2}$ channels appears S2 times. The sampling rate at the output of the input-side filter bank 10 equals $f_{A,Zw}$, and the sampling rates at the outputs of the output-side filter banks $11_1$ to $11_m$ and $12_1$ to $12_n$ equal $f_{A,TB1}$ and $f_{A,TB2}$ respectively.

If only a "reduced tree" exists, then some of the output-side channels are formed by the input-side filter bank 10. Consequently, the output-side filter banks $12_1$ to $12_n$ (shown dashed in FIG. 2), for example, can be dispensed with.

The objective now is to optimize the structure of the filter bank system shown in FIG. 2, in particular with regard to its use in hearing devices. In this case, the aim is to achieve a minimum possible group delay in the individual channels and a minimum possible overall power consumption, i.e. as few filter operations as possible. It has been found that the entire parameter space of the filter bank system can be reduced to essentially two parameters for optimization, namely the number of input channels $K_{Ein}$ and the oversampling factor $U_{Ein}$ of the input-side filter bank 10.

Figure 3:
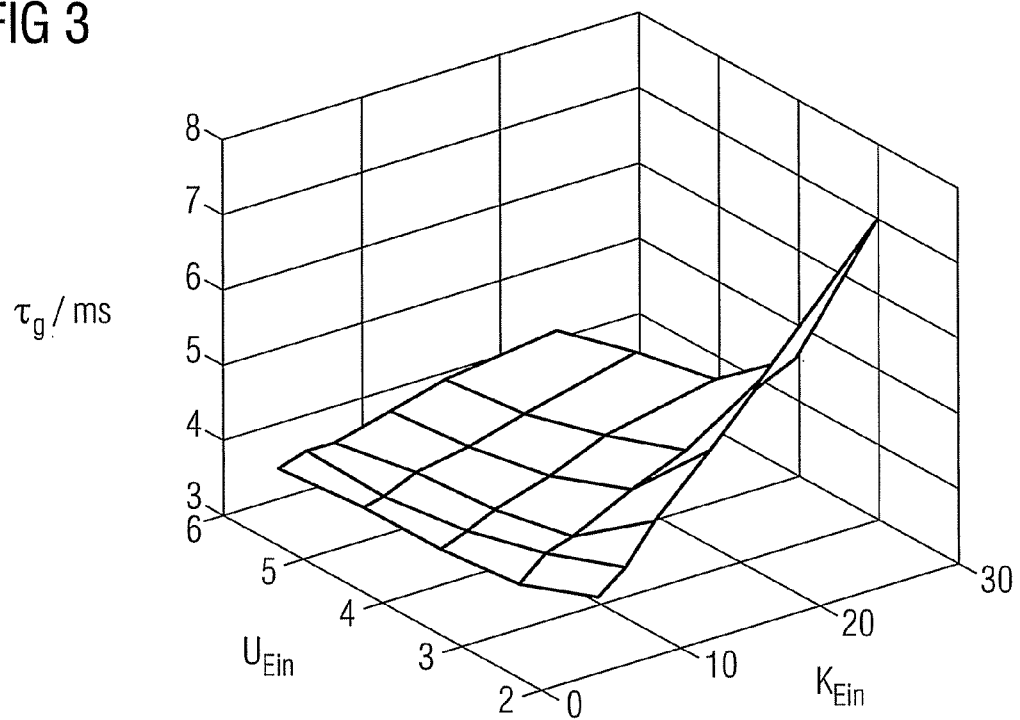
FIG. 3 shows a diagram of the group delay of the frequency group of the low frequencies as a function of $K_{Ein}$ and $U_{Ein}$.

First, the group delay of a frequency group of the low frequencies is analyzed as a function of the two parameters $K_{Ein}$ and $U_{Ein}$. Filters designed using the standard Remez method (linear phase FIR filters) are used for the analysis, as also for all subsequent analyses. The three-dimensional diagram of FIG. 3 plots the group delay $\tau_g$ against the parameters $U_{Ein}$ and $K_{Ein}$. A distinct rise in the group delay for the frequency group of the low frequencies is apparent in the right-hand corner, i.e. for high numbers of input channels $K_{Ein}$ and low oversampling factors $U_{Ein}$. So low group delays tend to lie in the front and rear regions of the diagram, with very low group delays in the left-hand corner of the diagram, i.e. for high oversampling factors $U_{Ein}$ and low numbers of input channels $K_{Ein}$. For higher frequencies, the group delay varies only insignificantly as a function of $U_{Ein}$ and $K_{Ein}$.

Figure 4:
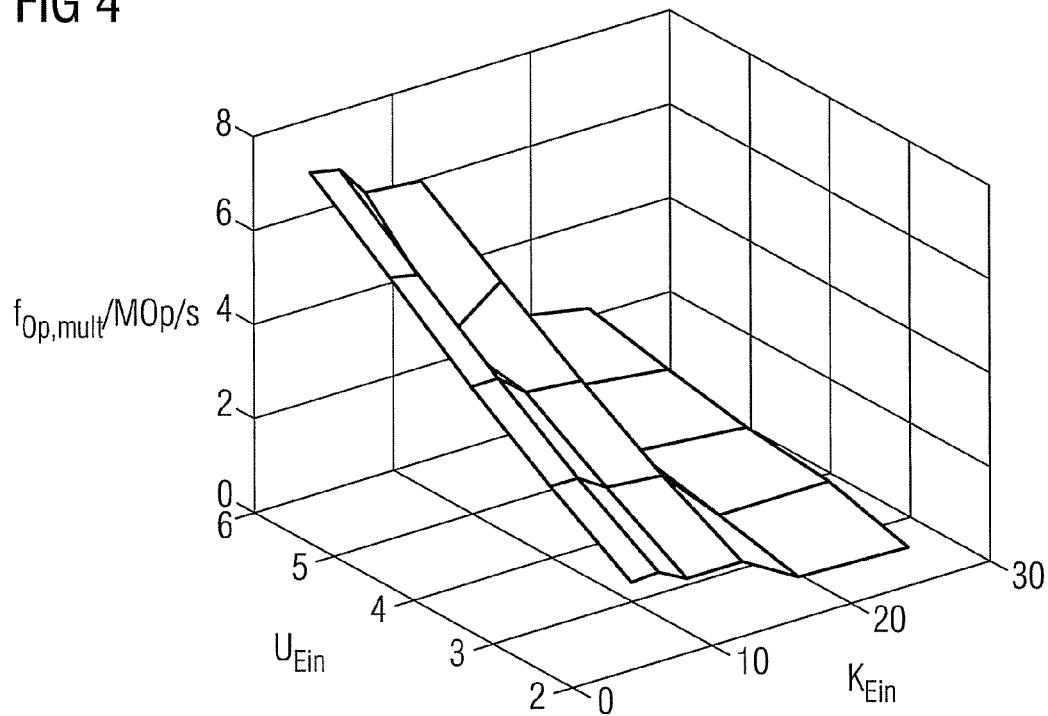
FIG. 4 shows a diagram of the operation rate for multiplications in the entire filter bank as a function of $K_{Ein}$ and $U_{Ein}$.

High oversampling factors $U_{Ein}$, however, mean that a high number of operations are needed, thereby increasing the power consumption. Consequently a compromise needs to be found between group delay and the number of operations or in other words the operation rate. Hence, as shown in FIG. 4, the operation rate $f_{OP,mult}$ (only for multiplications) of the entire filter bank has been calculated as a function of $K_{Ein}$ and $U_{Ein}$. The multiplication operation rate can be regarded here as representative of the overall operation rate of the filter bank. In the three-dimensional diagram of FIG. 4 it is apparent that the operation rate $f_{OP,mult}$ is relatively high in the left-hand corner, i.e. for a high oversampling factor $U_{Ein}$ and a low number of channels $K_{Ein}$. The operation rates are distinctly lower in the front and rear corners of the diagram, and at the lowest in the right-hand corner, i.e. for a high number of channels $K_{Ein}$ and a low oversampling factor $U_{Ein}$. Both optimization criteria, namely the group delay and operation rate, need to be considered simultaneously, however, as part of the optimization. In this case, it transpires, as already mentioned above, that the group delay of the frequency group of the high frequencies is hardly critical and hence does not need to be used for the optimization. Hence, considering FIGS. 3 and 4 together, optimum value pairs of the parameters $U_{Ein}$ and $K_{Ein}$ are obtained in the front and rear regions of the plane spanned by these two parameters $U_{Ein}$ and $K_{Ein}$ as shown in FIGS. 3 and 4.

The data rate "$f_{Daten}$" can additionally be used as an extra decision criterion for finding an optimum value pair $U_{Ein}/K_{Ein}$. The data rate is obtained by adding together all the sampling rates across all the sub-bands. As shown in FIG. 5, however, it is constant for a "full tree" of the filter system (cf. FIG. 2). It only depends on the parameters $U_{Ein}$ und $K_{Ein}$ in the housing of a "reduced tree". The output-side filter banks $12_1$ to $12_n$ have been dispensed with in the chosen example. This resulted in the data rate $f_{Daten}$ being dependent on both parameters $K_{Ein}$ and $U_{Ein}$. Referring to the three-dimensional diagram of FIG. 5, it would be best to use a reduced tree (high number of channels $K_{Ein}$) and to keep the oversampling factor $U_{Ein}$ of the input-side filter bank as low as possible. In this value-pair region, however, the group delay is relatively high (see FIG. 3).

All in all, a compromise needs to be found that takes account of all the optimization criteria (low group delay, low operation rate and low data rate if applicable). In the present example it transpires that a filter bank having the tree structure shown in FIG. 6 can be regarded as optimum. In this structure, the input-side filter bank 10 has a number of channels $K_{Ein}$=4 and an oversampling factor $U_{Ein}$=2. The optimum structure produces a full tree having four output-side filter banks $11_1$, $12_1$, $12_2$ and $12_3$. The output-side filter bank $11_1$ for the lower frequency range has the number of channels $K_{Aus}$=12 and the oversampling factor $U_{Aus}$=5. Three output-side filter banks $12_1$, $12_2$ and $12_3$ of the same type of filter bank are obtained for the upper frequencies. They each have the number of channels $K_{Aus}$=4 and an oversampling factor $U_{Aus}$=4. This results in 24 channels over the entire frequency range, i.e. a number of channels that equals at least 22, in accordance with the originally set requirements. The further requirement that a channel bandwidth of about 250 Hz is needed in the lowest bands, can also be satisfied by the structure of FIG. 6. In this optimized filter bank structure, the lower channels actually have a bandwidth of 240 Hz and the upper channels a bandwidth of 750 Hz. Hence using the optimization method according to the invention it is possible to optimize a multilevel structure composed of oversampled, complex modulated (optionally GDFT) polyphase filter banks specifically for applications of hearing apparatuses, in particular hearing aids.

In the housing where frequency-shifted, complex modulated (GDFT) polyphase filter banks are used, according to the invention, the best solution for implementing the frequency shift can be selected for each sub-filter bank: in the first housing, the input signal of the respective sub-filter bank is itself frequency shifted, with the prototype filter still having real coefficients, but being supplied with a complex signal (implementation as a DFT filter bank); the output signal must be frequency shifted again in the opposite direction. In the second housing, the prototype filter itself is complex modulated, meaning that it has complex coefficients but is supplied with a real signal. To preserve any symmetry there may be in the FIR filter coefficients, an appropriate choice is made for the zero phase of the carrier producing the frequency shift. The choice between the two options is made as follows: if the input signal of the respective sub-filter bank is real, then the second option is chosen; if it is complex then the first option is chosen. Hence in either housing this results in only half-complex multiplications being implemented in the prototype filters even for GDFT sub-filter banks. For a multilevel filter bank, the frequency shifts required in the first housing before and after the DFT filter bank can be combined, if applicable.

A further improvement with regard to computational complexity (power consumption) and group delay can be achieved by using NPR filter banks ("near perfect reconstruction filter banks") instead of PR filter banks ("perfect reconstruction filter banks"). The NPR filter banks can actually be designed to be adequate for intensive sub-band processing.

As a filter bank composed of at least two cascaded levels or as a (analysis) filter bank composed partially of at least two levels, it can be used to decompose the input signal into K sub-band signals having a reduced sampling rate. A digital synthesis filter bank (SFB) for re-synthesis after manipulating the sub-band signals can have a symmetrical design to the analysis filter bank (AFB).

In summary, the optimized filter bank structure can be used to achieve a shorter group delay, in particular for the wider-band channels centered around higher center frequencies, which constitutes an improvement over solution B mentioned in the introduction. The reduced computational complexity in the analysis-synthesis filter bank cascade can be cited as a further advantage of the optimized filter bank system, which constitutes in particular an improvement over a non-optimized solution C. Finally, a sharp reduction in computational complexity in the sub-band signal processing is also advantageously achieved by downsampling the sub-band signals and avoiding an excessive number of channels.

The filter bank system described above can be used in a hearing device or other hearing apparatus for example.

The invention claimed is:

1. A method for optimizing operating characteristics of a multilevel filter bank, comprising:
   providing the multilevel filter bank which has an input-side filter bank and an output-side filter bank of a defined filter type, with the input-side filter bank having a number of output channels as a variable first parameter, and an oversampling factor as a variable second parameter;
   determining a group delay for each of a plurality of value pairs of the first and second parameters;
   determining an operation rate for each of the plurality of value pairs of the first and second parameters;
   selecting one of the plurality of value pairs for which the associated group delay and the associated operation rate satisfy a defined criterion; and
   configuring the input-side filter bank with the number of channels and the oversampling factor corresponding to the selected value pair.

2. The method as claimed in claim 1, wherein levels of the multilevel filter bank differ across a full width of the bank, a cumulative sampling rate across all sub-bands of the multilevel filter bank is additionally determined as the data rate for each of the plurality of value pairs, and the respective data rate is used to select one of the plurality of value pairs.

3. The method as claimed in claim 2, wherein the input-side and output-side filter banks, with regard to a synthesis filter bank, are each an NPR filter bank.

4. The method as claimed in claim 3, wherein the defined criterion is to minimize the group delay and the operation rate.

5. The method as claimed in claim 2, wherein the defined criterion is to minimize the group delay and the operation rate.

6. The method as claimed in claim 2, wherein the input-side and output-side filter banks are each an oversampled, complex modulated polyphase filter bank.

7. The method as claimed in claim 6, wherein the defined criterion is to minimize the group delay and the operation rate.

8. The method as claimed in claim 1, wherein the input-side and output-side filter banks, with regard to a synthesis filter bank, are each an NPR filter bank.

9. The method as claimed in claim 1, wherein the input-side and output-side filter banks are each an oversampled, complex modulated polyphase filter bank.

10. The method as claimed in claim 1, wherein the defined criterion is to minimize the group delay and the operation rate.

11. A multilevel filter bank having a structure that is obtained by the method as claimed in claim 1.

12. A hearing apparatus having a multilevel filter bank as claimed in claim 11, in order to process an input signal of the hearing apparatus.

13. A hearing apparatus, comprising:
   a multilevel filter bank which has an input-side and an output-side filter bank of a defined filter type, with the input-side filter bank having a number of output channels as a variable first parameter, and an oversampling factor as a variable second parameter,
   wherein a group delay is determined for each of a plurality of value pairs of the first and second parameters,
   wherein an operation rate is determined for each of the plurality of value pairs of the first and second parameters,
   wherein one of the plurality of value pairs is selected for which the associated group delay and the associated operation rate satisfy a defined criterion, and
   wherein the input-side filter bank is configured with the number of channels and the oversampling factor corresponding to the selected value pair.

* * * * *